United States Patent
Sakuma

(10) Patent No.: US 9,379,268 B2
(45) Date of Patent: Jun. 28, 2016

(54) SOLAR CELL MODULE AND METHOD OF MANUFACTURING THE SAME

(71) Applicant: SANYO Electric Co., Ltd., Osaka (JP)

(72) Inventor: Toshiyuki Sakuma, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 15 days.

(21) Appl. No.: 14/615,571

(22) Filed: Feb. 6, 2015

(65) Prior Publication Data

US 2015/0155412 A1    Jun. 4, 2015

Related U.S. Application Data

(63) Continuation of application No. PCT/JP2012/071180, filed on Aug. 22, 2012.

(51) Int. Cl.
*H01L 31/05* (2014.01)
*H01L 31/02* (2006.01)
*H01L 31/048* (2014.01)

(52) U.S. Cl.
CPC ........ *H01L 31/0516* (2013.01); *H01L 31/0201* (2013.01); *H01L 31/048* (2013.01); *H01L 31/0508* (2013.01); *Y02E 10/50* (2013.01)

(58) Field of Classification Search
CPC ............ H01L 31/0516; H01L 31/0201; H01L 31/048; H01L 31/0508; H01L 31/00–31/078
See application file for complete search history.

(56) References Cited

U.S. PATENT DOCUMENTS

2005/0051204 A1*  3/2005  Oi .................. H01L 31/048
                                                    136/251
2011/0155203 A1   6/2011  Funakoshi

FOREIGN PATENT DOCUMENTS

| JP | 2009-043842 A | 2/2009 |
| JP | 2011-138929 A | 7/2011 |
| JP | 2012-070015 A | 4/2012 |
| WO | 2012-102320 A1 | 8/2012 |

* cited by examiner

*Primary Examiner* — Shannon Gardner
(74) *Attorney, Agent, or Firm* — Mots Law, PLLC

(57) ABSTRACT

Disclosed is a solar cell module that has a wiring member including a resin film, and a wiring disposed on the resin film and electrically connected to a solar cell. The wiring member includes a first portion disposed in that the wiring faces the solar cell, the first portion bonded to the solar cell, a second portion disposed in that the wiring faces an opposite side from the solar cell, and a bent portion connecting the first portion and the second portion to each other. A distance between a first protective member and a second protective member in a region where the wiring member is provided in an area located between the solar cell and the second protective member is longer than a distance between the first protective member and the second protective member in a region where the wiring member is not provided in the area.

8 Claims, 3 Drawing Sheets

US 9,379,268 B2

SOLAR CELL MODULE AND METHOD OF MANUFACTURING THE SAME

CROSS REFERENCE TO RELATED APPLICATIONS

This application is a continuation application of International Application No. PCT/JP2012/071180, filed on Aug. 22, 2012, entitled "SOLAR CELL MODULE AND METHOD OF MANUFACTURING THE SAME", the entire contents of which are incorporated herein by reference.

TECHNICAL FIELD

This disclosure relates to a solar cell module and a method of manufacturing the same.

BACKGROUND ART

Conventionally, a solar cell module having back contact solar cells is known as a solar cell module having improved photoelectric conversion efficiency. One example of the solar cell module is described in Patent Document 1, for example. A solar cell module described in Patent Document 1 includes back contact solar cells, and a circuit substrate on which wirings are provided. Solar cells are disposed in one direction on the circuit substrate with their back surfaces placed to face the circuit substrate, and are electrically connected to the circuit substrate. Portions of the circuit substrate outside a region in which the solar cell module is provided are folded to the opposite side from the solar cells.

PATENT DOCUMENT

Patent Document 1: Japanese Patent Application Publication No. 2009-43842

SUMMARY OF THE INVENTION

An embodiment of a solar cell module includes a first protective member, a second protective member, a sealant layer, a solar cell, and a wiring member. The second protective member is opposed to the first protective member. The second protective member is more flexible than the first protective member. The sealant layer is provided between the first protective member and the second protective member. The solar cell is provided inside the sealant layer. The solar cell includes a first main surface, and a second main surface. The first main surface faces the first protective member. The second main surface faces the second protective member. The wiring member includes a resin film and a wiring. The wiring is disposed on the resin film. The wiring is electrically connected to the solar cell on the second main surface. The wiring member includes a first portion, a second portion, and a bent portion. The first portion is disposed in such a manner that the wiring faces the solar cell. The first portion is bonded to the solar cell. The second portion is disposed in such a manner that the wiring faces the opposite side from the solar cell. The bent portion connects the first portion and the second portion to each other. A distance between the first protective member and the second protective member in a region provided with the wiring member in an area located between the solar cell and the second protective member is longer than a distance between the first protective member and the second protective member in a region not provided with the wiring member in the area.

An embodiment of a method of manufacturing a solar cell module includes: obtaining a stack by stacking a first protective member, a first resin sheet for forming an area of a sealant layer to be located between the first protective member and a solar cell, the solar cell with a wiring member, a second resin sheet for forming an area of the sealant layer to be located between the solar cell and a second protective member, and the second protective member one on top of another in this order; and laminating the stack. An area of the second resin sheet positioned above the wiring member has a larger thickness than the other area of the second resin sheet.

EMBODIMENTS

Figure 1:
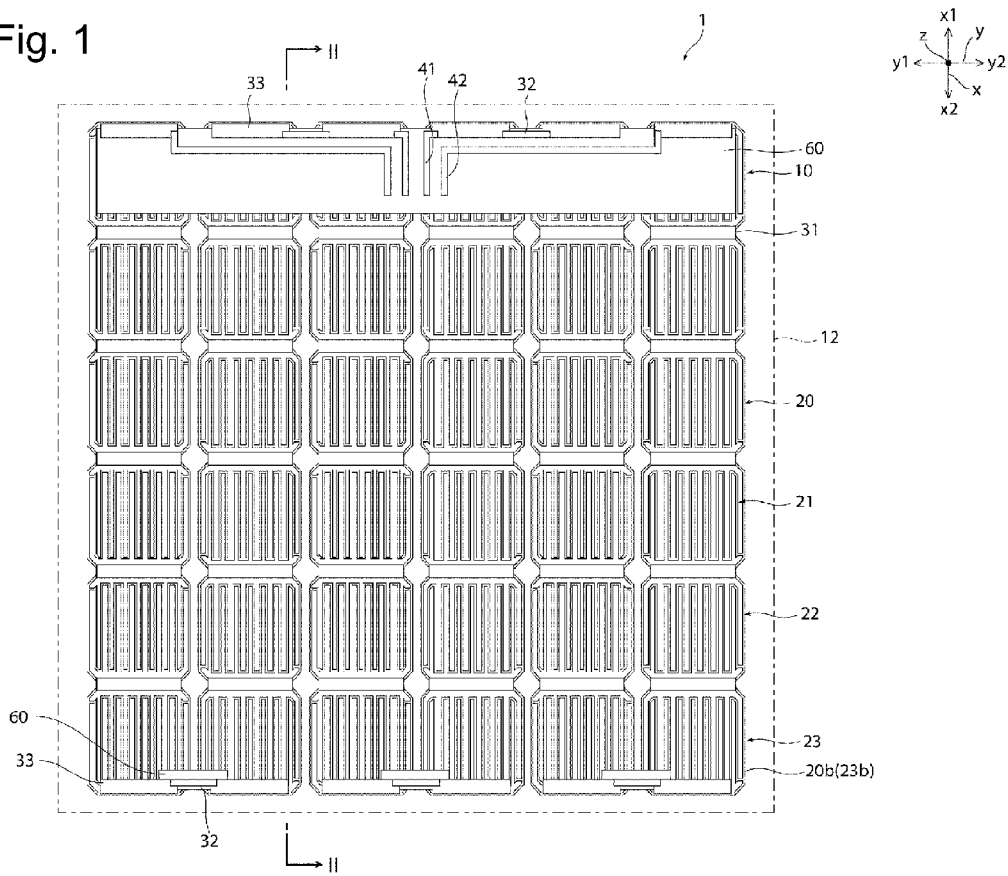
FIG. 1 is a schematic backside view of a solar cell module according to an embodiment of the invention.

Hereinafter, a preferable embodiment is described. However, the embodiment described below is merely illustrative. The invention is not limited to the embodiment described below.

In the figures referred to for describing the embodiment, a member having a substantially same function is referred to with a same reference numeral. Figures referred to in description of the embodiment are provided schematically. Therefore, the dimension ratio or the like of an object drawn in a figure may be different from that of a real object. The dimension ratio or the like of an object may be different between figures. The dimension ratio or the like of a specific object should be determined by considering description given below.

Figure 2:
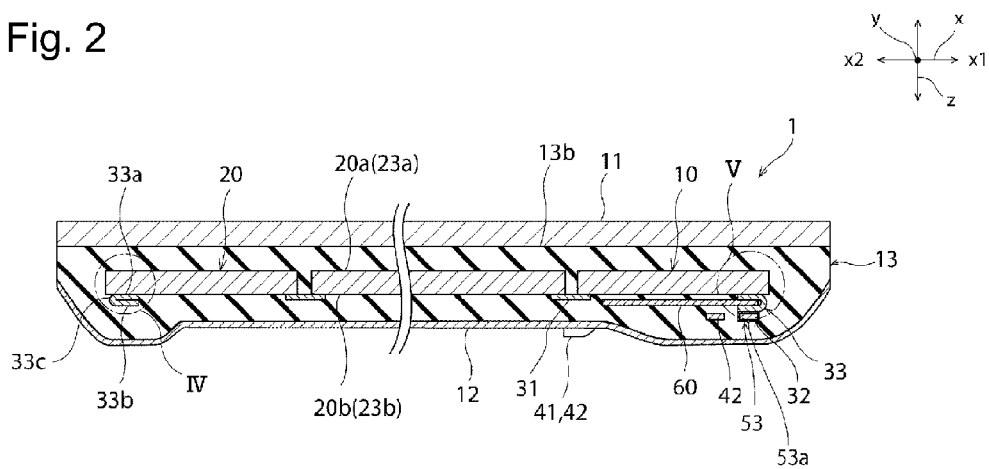
FIG. 2 is a schematic cross section of a section along line II-II of FIG. 1.

As illustrated in FIG. 1 and FIG. 2, solar cell module 1 includes solar cells 20. As illustrated in FIG. 2, solar cells 20 are disposed between first protective member 11 and second protective member 12. First protective member 11 is positioned on the side of light-receiving surfaces 20a of solar cells 20. First protective member 11 is made of a glass plate. Second protective member 12 is positioned on the side of back surfaces 20b of solar cells 20. Second protective member 12 faces first protective member 11 via solar cell 20. Flexibility of second protective member 12 is higher than flexibility of first protective member 11. Specifically, second protective member 12 is made of a flexible resin sheet.

Sealant layer 13 is provided between first protective member 11 and second protective member 12. Solar cells 20 are provided within sealant layer 13. Sealant layer 13 may be made of, for example, a crosslinkable resin such as ethylene vinyl acetate copolymer (EVA), and a non-crosslinkable resin such as polyvinyl butylal (PVB), polyethylene (PE), and polyurethane (PU).

Figure 3:
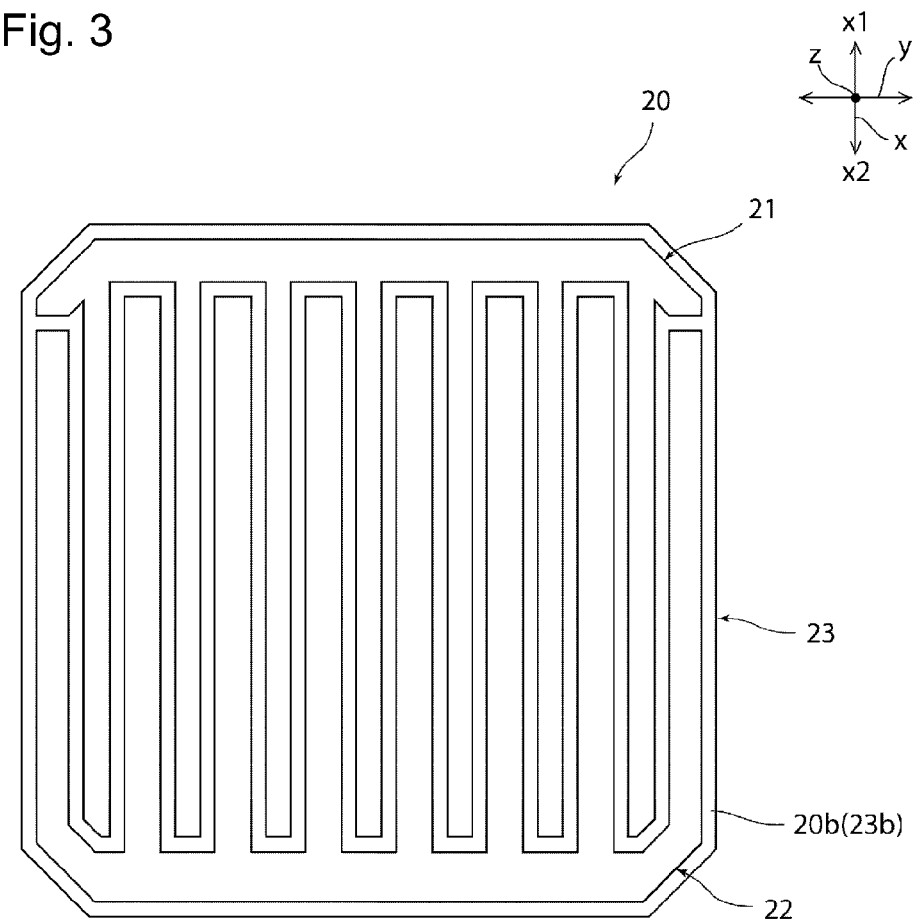
FIG. 3 is a schematic backside view of a solar cell according to an embodiment of the invention.

As illustrated in FIG. 2 and FIG. 3, solar cell 20 includes photoelectric conversion body 23 and first and second electrodes 21, 22. Photoelectric conversion body 23 includes first and second main surfaces 23a, 23b. First main surface 23a of photoelectric conversion body 23 forms light-receiving surface 20a of solar cell 20, and second main surface 23b forms back surface 20b of solar cell 20.

Photoelectric conversion body 23 is a member configured to generate carriers such as holes and electrons when light is received. Photoelectric conversion body 23 may be configured to generate carriers only when light is received on first main surface 23a, or generate carriers not only when light is received on first main surface 23a, but also when light is received on second main surface 23b. That is, solar cell 20 may be a double-sided light receiving solar cell.

A type of photoelectric conversion body 23 is not limited particularly. Photoelectric conversion body 23 may be formed by using, for example, a crystal silicon substrate or the like.

First electrode 21 and second electrode 22 are disposed on second main surface 23b of photoelectric conversion body 23. Accordingly, solar cell 20 is a back contact solar cell. However, according to the invention, the solar cell may be not a back contact solar cell.

As illustrated in FIG. 1, solar cells 20 form solar cell strings 10. Each of solar cell strings 10 includes solar cells 20 disposed in the x axis direction. Solar cells 20 are electrically connected to each other by first wiring members 31 in each of solar cell strings 10. Specifically, first electrode 21 of one solar cell 20 out of solar cells 20 adjacent in the X axis direction, and second electrode 22 of the other solar cell 20 are electrically connected to each other via first wiring member 31.

First wiring member 31 may be made of, for example, a metal foil such as Ag and Cu. The metal foil may be a laminate of metal foils. The metal foil may be coated, for example, with a coating layer comprising such as solder.

First wiring member 31 and back surface 20b of solar cell 20 are bonded to each other via an adhesive layer not illustrated. The adhesive layer may be made of, for example, a cured resin adhesive, a cured resin adhesive mixed with dispersed conductive material, solder, and the like.

Solar cell strings 10 are electrically connected to each other via second wiring members 32. Lead electrodes 41, 42 are electrically connected to solar cell strings 10 electrically connected to each other. Lead electrodes 41, 42 are drawn to the outside of sealant layer 13 and reach the outside of second protective member 12, as illustrated in FIG. 2.

Each of lead electrodes 41, 42 and second wiring members 32 may be made of, for example, a metal foil such as Ag and Cu. The metal foil may be a laminate of metal foils. The metal foil may be coated, for example, with a coating layer comprising such as solder.

First wiring members 31 and lead electrodes 41, 42 are electrically connected to solar cells 20 via third wiring members 33.

Figure 4:
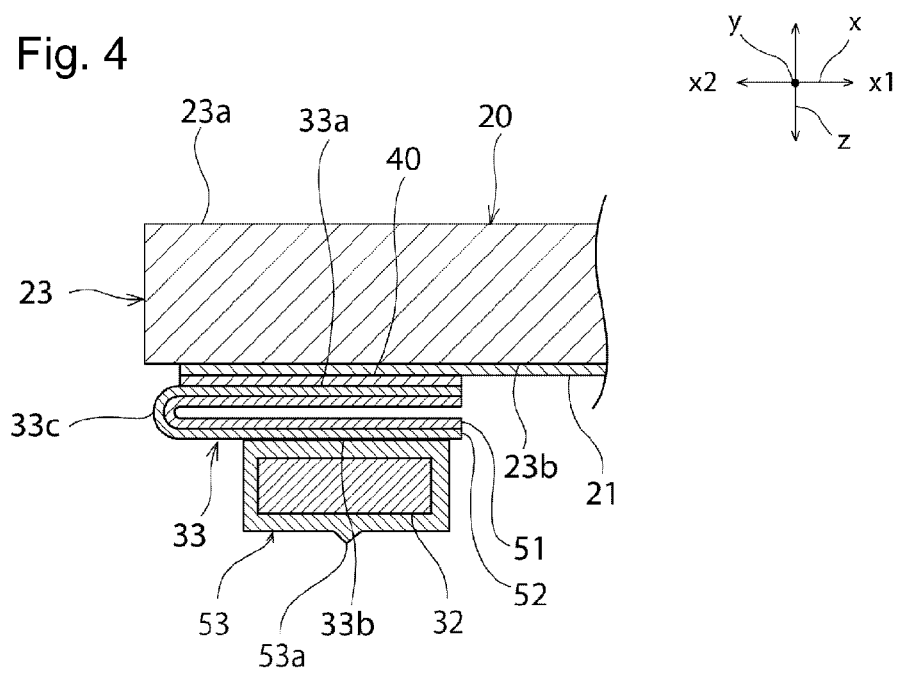
FIG. 4 is a schematic cross section of a solar cell string at an area IV of FIG. 2.
Figure 5:
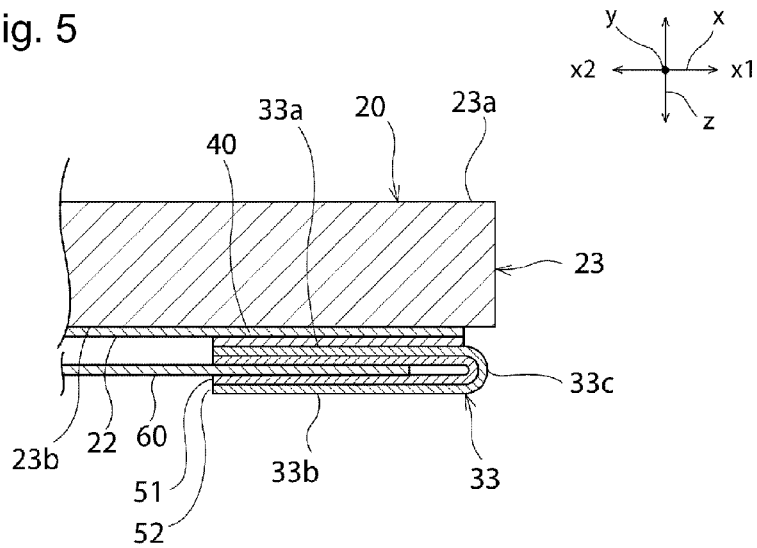
FIG. 5 is a schematic cross section of a solar cell string at an area V of FIG. 2.

As illustrated in FIG. 4 and FIG. 5, third wiring member 33 is made of a flexible print circuit substrate including resin film 51 and wiring 52. Resin film 51 may be made of, for example, a resin such as polyimide (PI) and polyethylene terephthalate (PET). Wiring 52 is disposed on resin film 51. Wiring 52 is electrically connected to first electrode 21 or second electrode 22 on back surface 20b. Wiring 52 may be made of, for example, a metal foil containing at least one kind of metal such as Cu or Ag.

Third wiring member 33 includes first portion 33a, second portion 33b, and bent portion 33c. First portion 33a is constituted by a portion on one side of third wiring member 33. First portion 33a is disposed in such a manner that wiring 52 can face solar cell 20. First portion 33a is bonded to back surface 20b of solar cell 20 with adhesive layer 40 formed of a resin adhesive or solder.

Second portion 33b is constituted by a portion on the other side of third wiring member 33. Second portion 33b is disposed in such a manner that wiring 52 can face the opposite side from solar cell 20. At least a part of second portion 33b is arranged above first portion 33a. In other words, at least the part of second portion 33b overlaps first portion 33a in a z axis direction which is a thickness direction of solar cell 20.

Bent portion 33c connects first portion 33a and second portion 33b to each other. Bent portion 33c includes a bent structure. In bent portion 33c, wiring 52 faces outward. Bent portion 33c is disposed on back surface 20b of solar cell 20. That is, bent portion 33c overlaps solar cell 20 in z axis direction. Bent portion 33c is a portion formed by bending a flat wiring member.

In second portion 33b, wiring 52 of third wiring member 33 is electrically connected to second wiring member 32 or lead electrodes 41, 42 made of the metal foil. Second wiring member 32 or lead electrodes 41, 42 are electrically connected to wiring 52 via solder 53 illustrated in FIG. 2 and FIG. 4.

Insulating sheet 60 is disposed between back surface 20b of solar cell 20 and each of second wiring member 32 and lead electrodes 41, 42 made of the metal foil. This suppresses short-circuit between electrodes 21, 22 and any of second wiring member 32 and lead electrodes 41, 42. Insulating sheet 60 may be made of, for example, polyimide (PI), polyethylene terephthalate (PET), vinyl acetate copolymer (EVA), polyvinyl butylal (PVB), polyethylene (PE), polyurethane (PU), and the like.

In this connection, third wiring member 33 having a bent structure is thicker than a wiring member not having a bent structure. For this reason, a distance between second portion 33b of third wiring member 33 and second protective member 12 is shorter. In other words, an area of sealant layer 13 located between second portion 33b and second protective member 12 has a smaller thickness. For this reason, third wiring member 33, and second wiring member 32 and lead electrodes 41, 42 positioned above third wiring member 33 may come into contact with or pierce second protective member 12 made of a resin sheet. In particular, since solder 53 is used to electrically connect second wiring member 32 or lead electrodes 41, 42 to wiring 52, bump portion 53a may be generated when a soldering iron is removed from wiring 52. Bump portion 53a, if any, is likely to pierce second protective member 12. When bent portion 33c is positioned above solar cell 20, the thickness of third wiring member 33 is further larger, and accordingly bump portion 53a is more likely to pierce second protective member 12. Pierced second protective member 12 causes a problem such as entry of water into solar cell module 1.

Here, in solar cell module 1, back side area 13b of sealant layer 13, which is an area located between solar cell 20 and second protective member 12, is formed such that regions provided with third wiring members 33 have a larger thickness than the other region not provided with third wiring members 33 as illustrated in FIG. 2. This inhibits third wiring members 33, or second wiring members 32, lead electrodes 41, 42 or the like positioned above third wiring members 33 from coming into contact with or piercing second protective member 12 made of the resin sheet. Accordingly, solar cell module 1 having improved reliability can be achieved.

Preferably, in back side area 13b, the regions provided with third wiring members 33, second wiring members 32, and lead electrodes 41, 42 have a larger thickness than the region not provided with third wiring members 33, second wiring members 32, or lead electrodes 41, 42.

Figure 6:
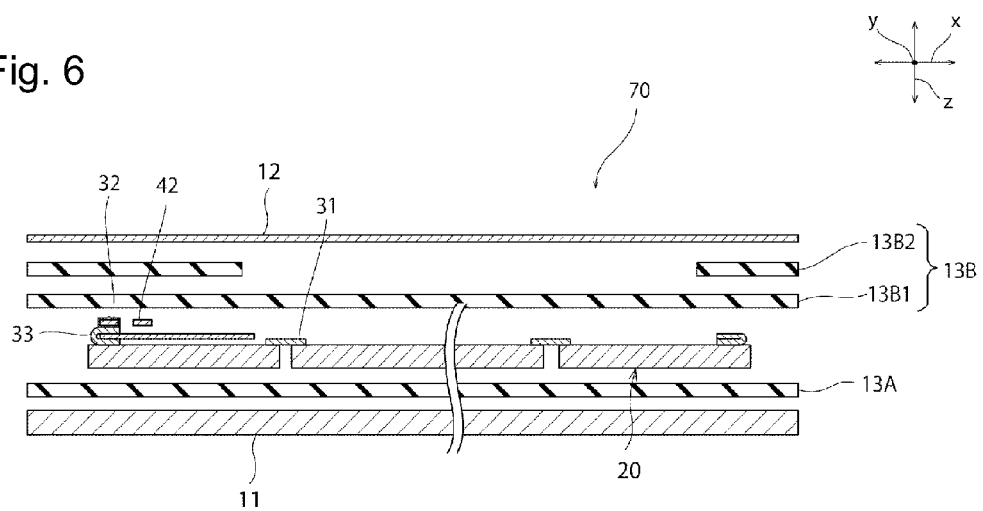
FIG. 6 is a schematic exploded cross section of a laminate.

Solar cell module 1 may be manufactured, for example, according to the following procedure. Firstly, as illustrated in FIG. 6, stack 70 is formed by stacking first protective member 11 made of a glass plate, first resin sheet 13A for forming an area of sealant layer 13 located between first protective member 11 and solar cells 20, solar cells 20, wiring members 31, 32 and 33, lead electrodes 41, 42, second resin sheet 13B for forming an area of sealant layer 13 located between solar cell 20 and second protective member 12, and second protective member 12 one on top of another in this order.

To address this, second resin sheet 13B includes a laminate of third resin sheet 13B1 covering the entire surface of first protective member 11, and fourth resin sheets 13B2 positioned above third wiring members 33. Hence, the thickness of areas of second resin sheet 13B positioned above third wiring members 33 is larger than thickness of the other area.

Next, stack 70 is laminated to complete solar cell module 1.

The invention is not limited to solar cell module 1 manufactured in accordance with the procedure described above. For example, a solar cell module may be manufactured by using third resin sheet 13B1 only without using fourth resin sheet 13B2 illustrated in FIG. 6. In this case, solar cell module 1 can be completed by laminating stack 70 not including fourth resin sheet 13B2 while applying a higher pressure in the z axis direction to a region not provided with fourth resin sheet 13B2 in FIG. 6 than to a region provided with fourth resin sheet 13B2 in FIG. 6.

Modified Example

Figure 7:
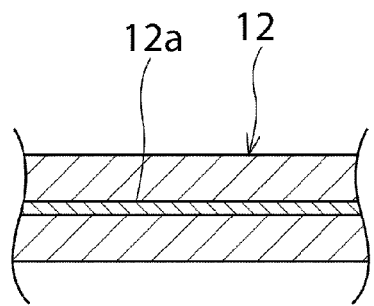
FIG. 7 is a schematic cross section of a second protective member according to a modified example.

As illustrated in FIG. 7, second protective member 12 may include metal layer 12a made of, for example, aluminum. In this case, a longer distance can be obtained between metal layer 12a and third wiring member 33 or the like, and thereby improved insulation properties can be achieved.

The solar cell module according to the invention may include only one solar cell.

In this way, the embodiments above provide a solar cell module having improved reliability.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
   a first protective member;
   a second protective member opposed to the first protective member and more flexible than the first protective member;
   a sealant layer provided between the first protective member and the second protective member;
   a solar cell provided inside the sealant layer, the solar cell having a first main surface facing the first protective member, and a second main surface facing the second protective member;
   a wiring member including a resin film, and a wiring disposed on the resin film and electrically connected to the solar cell on the second main surface;
   a first metal foil; and
   a second metal foil,
   wherein the wiring member comprises:
      a first portion disposed in such a manner that the wiring faces the solar cell, the first portion bonded to the solar cell;
      a second portion opposed to the first portion and disposed in such a manner that the wiring faces an opposite side from the solar cell; and
      a bent portion connecting the first portion and the second portion to each other, and
   the first metal foil is provided at a position overlapping with the second portion of the wiring member and electrically connected with the second portion of the wiring member,
   the second metal foil provided at a position not overlapping with either of the first Portion or the second portion of the wiring member,
   wherein a distance between the first protective member and the second protective member in a first region where the wiring member, the first metal foil, and the second metal foil are provided in an area located between the solar cell and the second protective member is longer than a distance between the first protective member and the second protective member in a second region where the wiring member, the first metal foil, or the second metal foil is not provided in the area.

2. The solar cell module according to claim 1, further comprising
   Wherein the sealant layer located between the solar cell and the second protective member has a thickness larger in the first region provided with the wiring member and the first and second metal foils than in the second region not provided with the wiring member and the first and second metal foils.

3. The solar cell module according to claim 2, further comprising solder connecting the first metal foil and the wiring to each other.

4. The solar cell module according to claim 1, wherein the sealant layer located between the solar cell and the second protective member has the thickness larger in a region provided with the wiring member than a region not provided with the wiring member.

5. The solar cell module according to claim 1, wherein the second protective member includes a metal layer.

6. The solar cell module according to claim 2, comprising solar cell strings each including two or more of the solar cells arranged in one direction and electrically connected to each other,
   wherein the first metal foil electrically connects the solar cell strings to each other.

7. The solar cell module according to claim 2, wherein the second metal foil is drawn to outside of the sealant layer.

8. The solar cell module according to claim 1, wherein the bent portion overlaps with the solar cell such that no portion of the bent portion extends outside of the solar cell as seen in a thickness direction of the solar cell.

* * * * *